(12) United States Patent
Hong et al.

(10) Patent No.: US 7,557,335 B2
(45) Date of Patent: *Jul. 7, 2009

(54) CMOS IMAGE SENSOR WITH PHOTO DIODE GATE

(75) Inventors: Sungkwon (Chris) Hong, Boise, ID (US); Jeff A. McKee, Meridian, IA (US)

(73) Assignee: Aptina Imaging Corporation, Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 11/771,255

(22) Filed: Jun. 29, 2007

(65) Prior Publication Data

US 2008/0011942 A1 Jan. 17, 2008

Related U.S. Application Data

(63) Continuation of application No. 10/656,165, filed on Sep. 8, 2003, now Pat. No. 7,253,392.

(51) Int. Cl.
*H01L 31/00* (2006.01)

(52) U.S. Cl. .................. 250/214.1; 250/208.1; 257/258; 257/291

(58) Field of Classification Search .............. 250/208.1, 250/214.1; 257/257, 258, 290, 291, 292, 257/293, 294, 431, 222, 223, 235, 228
See application file for complete search history.

(56) References Cited

U.S. PATENT DOCUMENTS

| | | | |
|---|---|---|---|
| 5,128,735 A | 7/1992 | Ohmi et al. | |
| 5,313,080 A | 5/1994 | Jung | |
| 5,625,210 A | 4/1997 | Lee et al. | |
| 5,877,521 A * | 3/1999 | Johnson et al. | 257/223 |
| 6,040,593 A | 3/2000 | Park | |
| 6,100,551 A * | 8/2000 | Lee et al. | 257/232 |
| 6,140,630 A | 10/2000 | Rhodes | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 6,566,697 B1 | 5/2003 | Fox et al. | |
| 6,706,550 B2 * | 3/2004 | Lee et al. | 438/57 |
| 6,809,309 B2 | 10/2004 | Kwon | |
| 6,835,590 B2 | 12/2004 | Lee | |
| 6,909,126 B1 * | 6/2005 | Janesick | 257/184 |
| 2004/0089883 A1 | 5/2004 | Kim | |
| 2005/0023437 A1 * | 2/2005 | Huang et al. | 250/208.1 |
| 2006/0157645 A1 * | 7/2006 | Manabe et al. | 250/214.1 |

* cited by examiner

*Primary Examiner*—Stephen Yam
(74) *Attorney, Agent, or Firm*—Dickstein Shapiro LLP

(57) ABSTRACT

A photodiode has a photodiode gate structure on the surface of the substrate. The photodiode may be located in a pixel sensor cell comprising a substrate having a first surface level. The photodiode has a first doped region of a first conductivity type and a second doped region of a second conductivity type located beneath the first surface level of the substrate. A photodiode gate is formed of a first dielectric substance layer formed over the first surface of the substrate, thereby forming a second surface, and a second polysilicon layer formed over the second surface of the first layer. A transistor is located adjacent to the photodiode. The photodiode gate improves charge transfer from the photodiode to the transfer gate and floating diffusion region. The improved charge transfer minimizes image lag and leakage and reduces energy barriers.

13 Claims, 13 Drawing Sheets

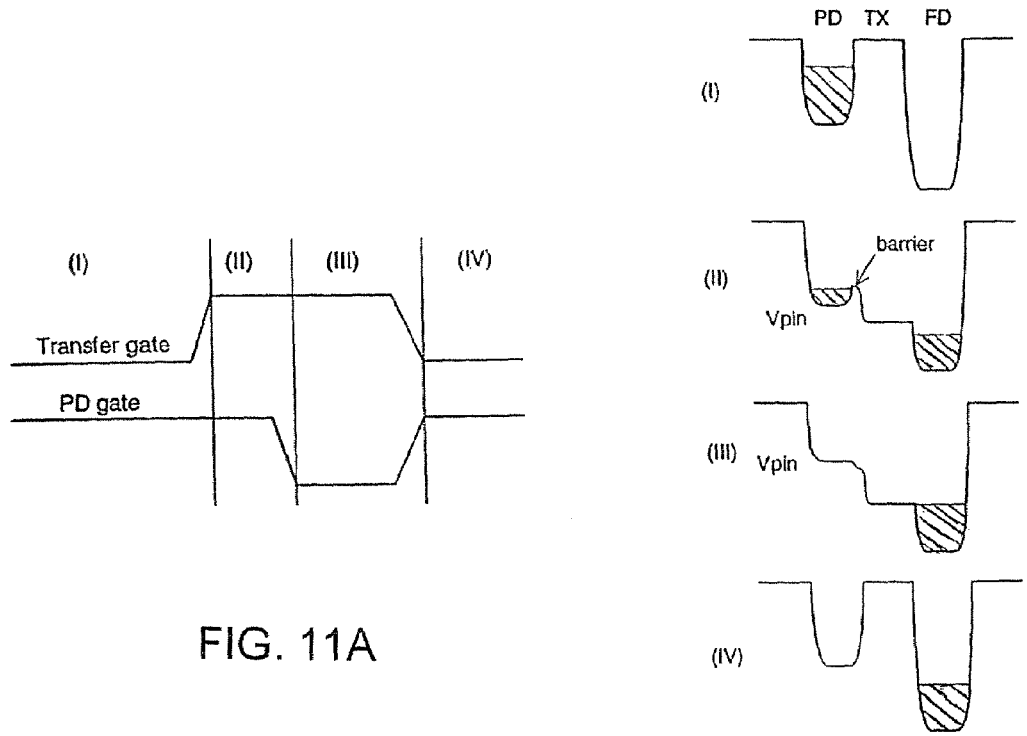
FIG. 11A
FIG. 11B
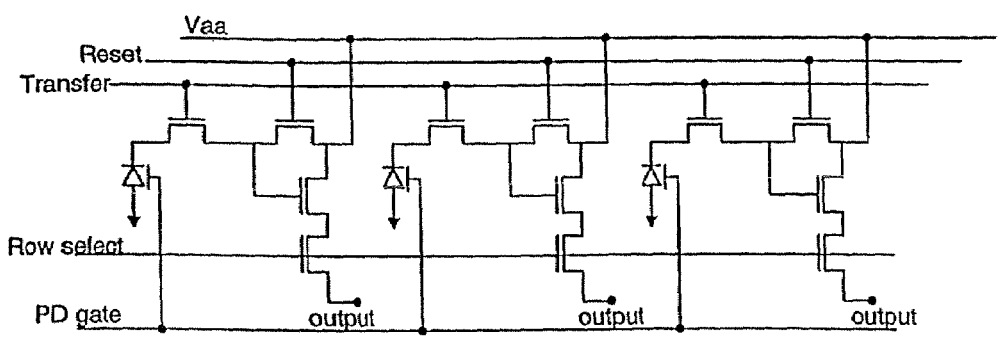
FIG. 11C

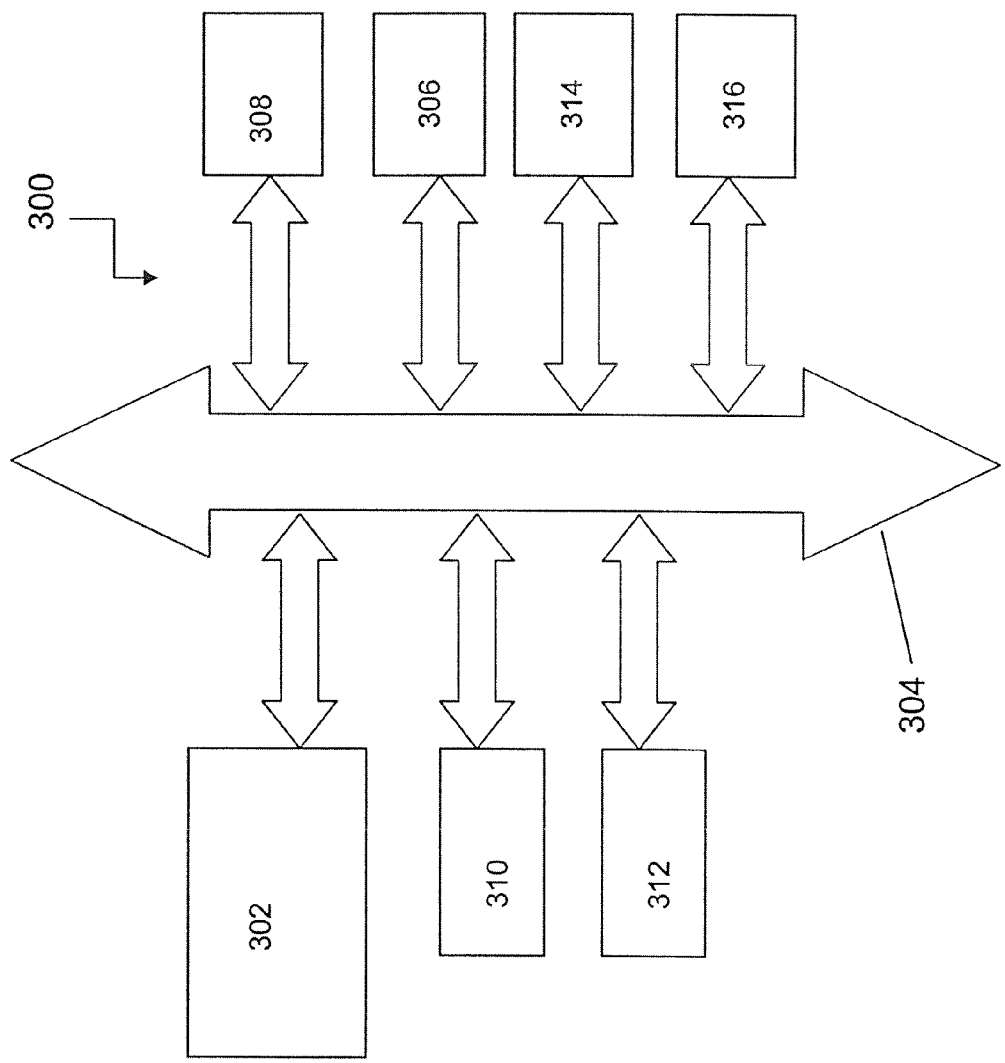

CMOS IMAGE SENSOR WITH PHOTO DIODE GATE

CROSS-REFERENCE TO RELATED APPLICATION

This application is a continuation of application Ser. No. 10/656,165, filed Sep. 8, 2003 now U.S. Pat. No. 7,253,392, the disclosure of which is incorporated herein by reference in its entirety.

FIELD OF THE INVENTION

The invention relates generally to a method and apparatus for formation of an imager. In particular, the invention relates to imagers with a photodiode gate.

BACKGROUND

Typically, a digital imager array includes a focal plane array of pixel cells, each one of the cells including a photo-conversion device, e.g. a photodiode gate, photoconductor, or a photodiode. In a CMOS imager a readout circuit is connected to each pixel cell which typically includes a source follower output transistor. The photoconversion device converts photons to electrons which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing are hereby incorporated by reference herein in their entirety.

A known imager device has a pixel array with a plurality of pixels arranged in a predetermined number of columns and rows. The pixels of each row in an array are all turned on at the same time by a row select line, and the pixels of each column are selectively output by respective column select lines. A plurality of row and column lines are provided for an entire array. The row lines are selectively activated by a row driver in response to a row address decoder. The column select lines are selectively activated by a column driver in response to a column address decoder. Thus, a row and column address is provided for each pixel. The imager is operated by a timing and control circuit, which controls the row and column address decoders for selecting the appropriate row and column lines for pixel readout. The control circuit also controls the row and column driver circuitry such that these apply driving voltages to the drive transistors of the selected row and column lines. The pixel column signals, which typically include a pixel reset signal ($V_{rst}$) and a pixel image signal ($V_{sig}$), are read by a sample and hold circuit associated with the column device. A differential signal ($V_{rst}-V_{sig}$) is produced by a differential amplifier for each pixel which is digitized by an analog to digital converter (ADC). The analog to digital converter supplies the digitized pixel signals to an image processor which forms a digital image.

A known image sensor is depicted in cross-section in FIG. 1. A 4-transistor (4T) image sensor has a transfer transistor 56, reset transistor 57, source follower transistor (not shown) and row select transistor (not shown). The photodiode 59 shown in FIG. 1 is a conventional p-n-p photodiode having a p-type region 10 closest to the surface with an n-type region 12 aligned vertically beneath the p-type region 10. The photodiode 59 detects photon energy and generates electrons which are collected in the photodiode while the transfer gate is "OFF." When the transfer gate is "ON," the photon-generated electrons are transferred to the floating diffusion region 11 because of the potential difference existing between the photodiode and floating diffusion region. The electrons are then converted to voltage signals that will be read at the source follower gate.

Applicants have determined that there are two significantly high energy barriers for electrons to overcome. The barriers occur between the photodiode 59 and the floating diffusion region 11 and between the photodiode 59 and the gate of the transfer transistor 56. It becomes necessary to minimize these two energy barriers to fully utilize the generated electrons. The higher the energy barrier, the lower the output signal and responsivity in weak light intensity conditions. Image lag can also result from high energy barriers when electrons collected in the photodiode are not completely transferred before the sensor is reset.

In addition, in short gate length sensors, sub-threshold current can become significantly high because of the breakdown between n-type regions on either side of the transfer gate. In particular, the n-type region 12 of the photodiode 59 may have increased leakage problems. The depletion edge 41 in n-type region 12 is shown with a dotted line. The energy barrier between the photodiode and the transfer gate should be reduced as much as possible or eliminated in order to control leakage and maximize charges transferred from the photodiode.

SUMMARY

The present invention provides a photodiode having a photodiode gate structure. The photodiode is located in a pixel sensor cell comprising a substrate having a first surface level. The photodiode has a first doped region of a first conductivity type and a second doped region of a second conductivity type located beneath a first level of the substrate. A photodiode gate is formed of a first dielectric substance layer formed over the first level, thereby forming a second surface, and a second polysilicon layer formed over the second surface of the first layer.

The photodiode gate may be connected to a negative bias to affect the pinning voltage of the photodiode. The photodiode gate improves charge transfer from the photodiode to the transfer gate and floating diffusion region. The improved charge transfer minimizes image lag and leakage and reduces energy barriers.

Additional features of the present invention will be apparent from the following detailed description and drawings which illustrate exemplary embodiments of the invention.

BRIEF DESCRIPTION OF THE DRAWINGS

FIG. 11(a), FIG. 11(b) and FIG. 11(c) show timing, energy band and circuit diagrams for the sensor of FIG. 2;

FIG. 13 is a schematic diagram of a processing system employing a CMOS imager constructed in accordance with the present invention.

DETAILED DESCRIPTION OF PREFERRED EMBODIMENTS

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transistors for converting photons to an electrical signal. For purposes of illustration, a single representative pixel and its manner of formation is illustrated in the figures and description herein; however, typically fabrication of a plurality of like pixels proceeds simultaneously. In the following description, the invention is described in relation to a CMOS imager for convenience; however, the invention has wider applicability to any photodiode of any imager cell, including for example, a CCD imager. Accordingly, the following detailed description is not to be taken in a limiting sense, and the scope of the present invention is defined only by the appended claims.

Figure 2:
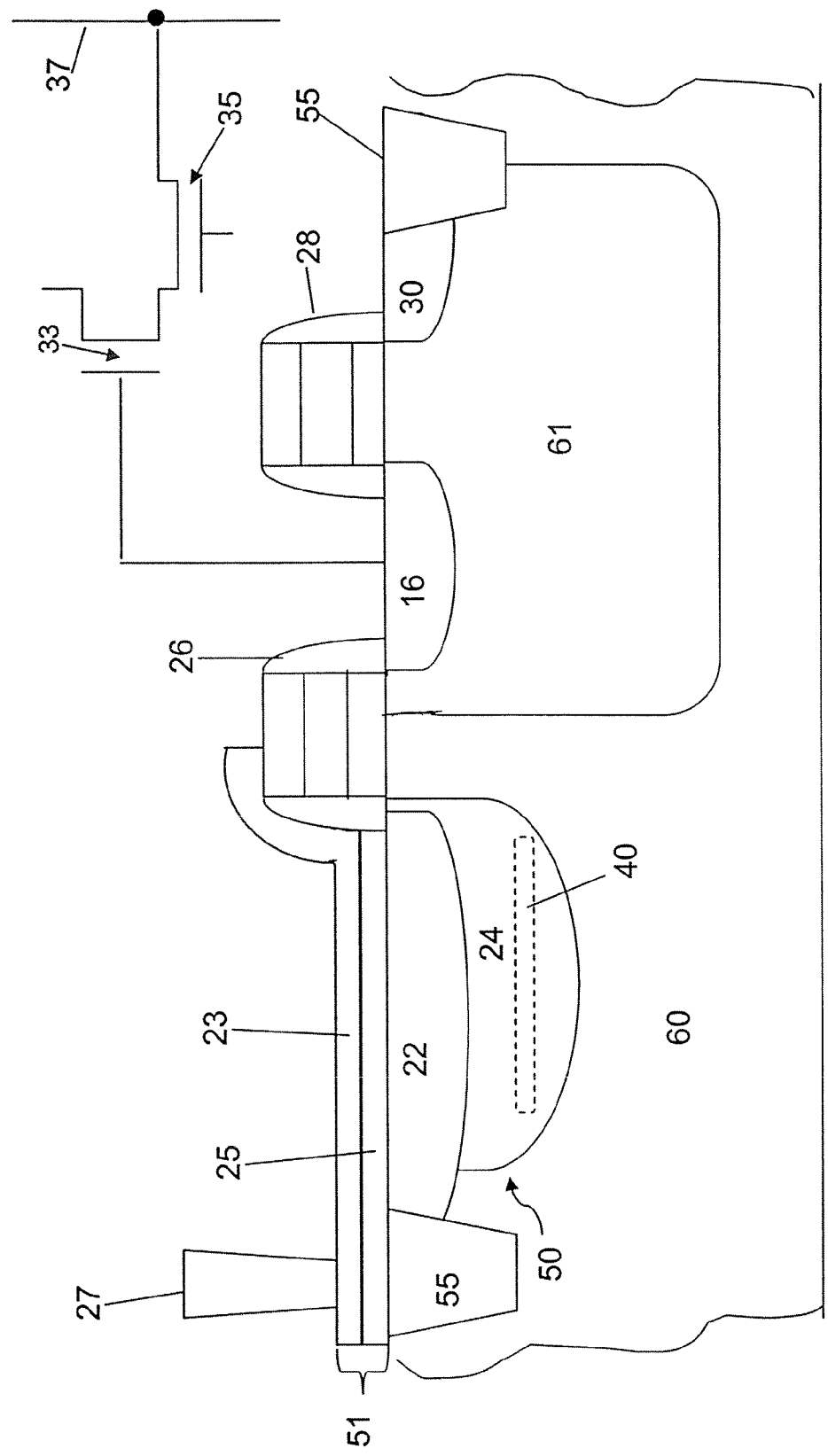
FIG. 2 is a cross-sectional view of an image sensor according to an embodiment of the invention.

Now referring to the figures, where like reference numbers designate like elements, FIG. 2 shows a cross-sectional view of a pixel sensor cell constructed in accordance with a first embodiment of the invention. A photoconversion device 50 is formed in a p-type substrate 60 having a higher doped p-type well 61. The photoconversion device 50 is a pinned photodiode and may be a p-n junction photodiode, a Schottky photodiode, or any other suitable photodiode, but for exemplary purposes is discussed as a p-n-p photodiode.

Figure 1:
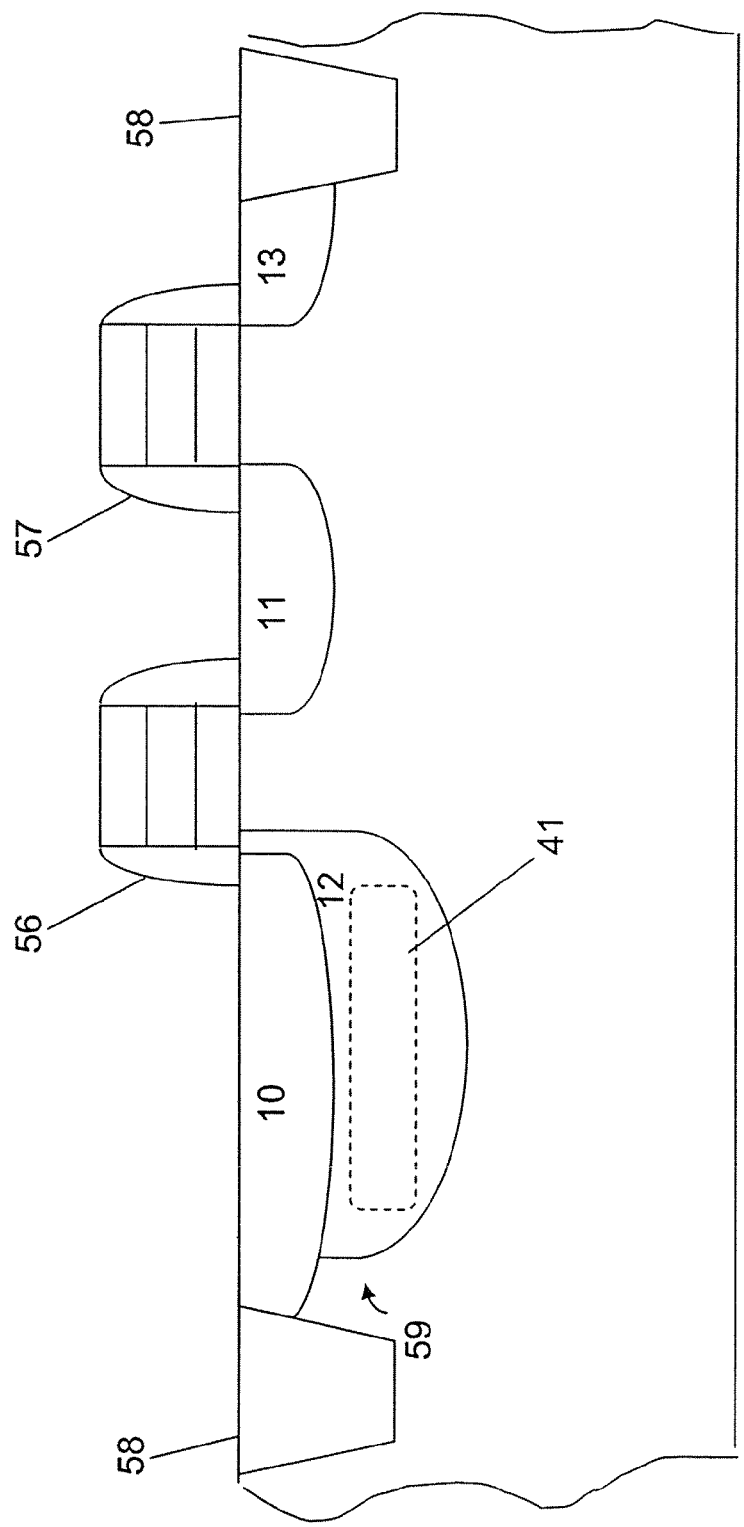
FIG. 1 is a cross-sectional view of a known image sensor.

The exemplary photodiode 50, as shown in FIG. 2, consists of a p+ region 22 and an n-type region 24. A photodiode gate 51 having dielectric substance layer 25 and polysilicon layer 23 is formed over the photodiode 50 area. Pinning voltage ($V_{PIN}$) may be controlled by applying voltage at the photodiode gate 51 through contact 27. When negative bias is applied to photodiode gate 51, the depletion region 40 in n-type region 24 will be reduced and narrowed in comparison, for example, to the depletion region 41 shown in FIG. 1. The higher the negative bias applied at photodiode gate 51, the lower $V_{PIN}$ and the smaller charge capacity at the photodiode 50. Lowering the $V_{PIN}$ decreases the energy barrier between the photodiode 50 and the floating diffusion region 16.

The remaining structures shown in FIG. 2 include a transfer transistor with associated gate 26 and a reset transistor with associated gate 28. Source/drain regions 30 and shallow trench isolation (STI) regions 55 are also shown. A charge collection region is also included and for exemplary purposes is shown as a floating diffusion region 16. A source follower transistor 33 and row select transistor 35 with associated gates are also included in the pixel sensor cell. The transistors 33, 35 are depicted in FIG. 2 in electrical schematic form with the output of the row select transistor 35 being connected to a column line 37. Although shown in FIG. 2 as a 4-transistor (4T) configuration with a transfer transistor, the invention can also be utilized in a 3-transistor (3T) configuration, without a transfer transistor, and in pixels with other higher transistor number configurations.

Figure 3:
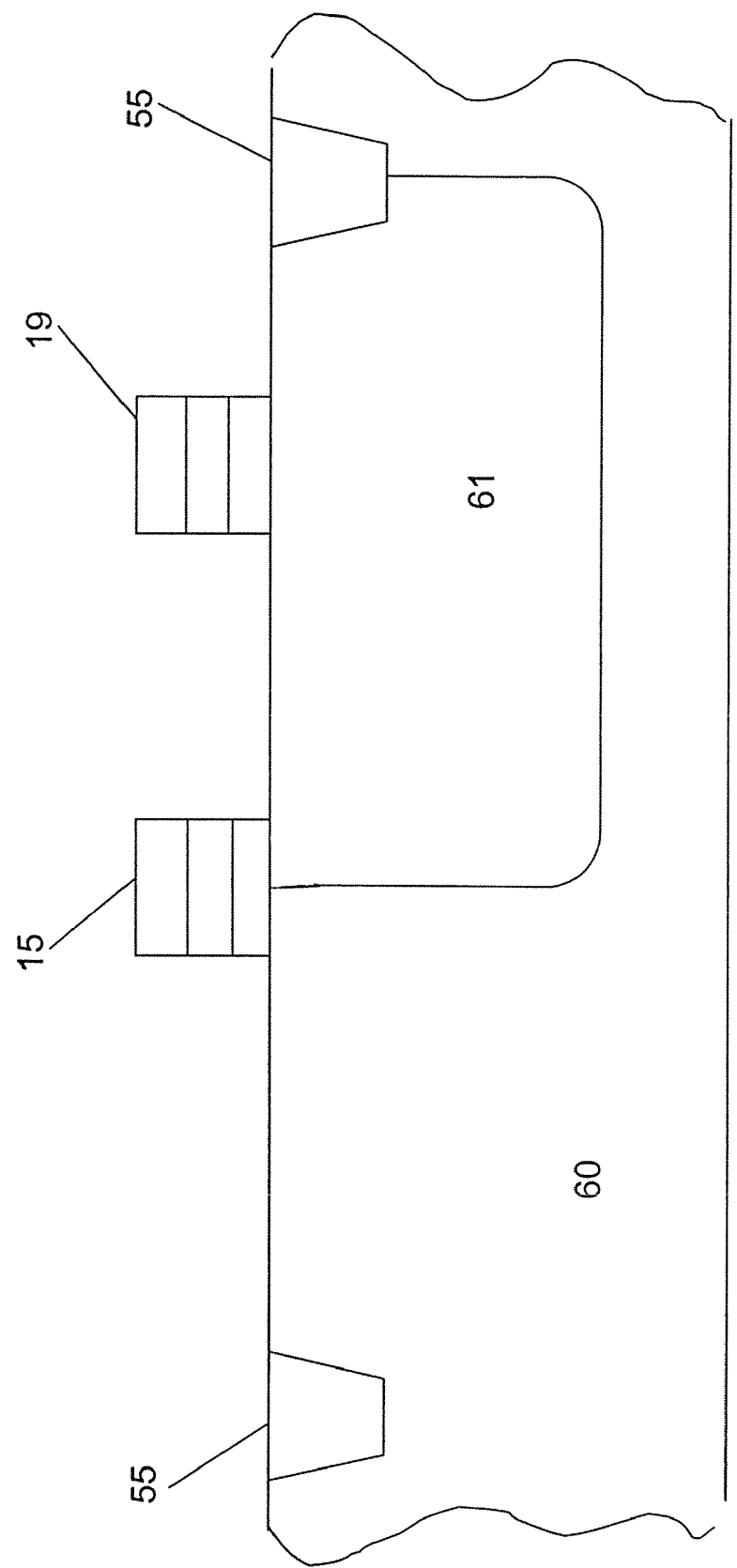
FIG. 3 shows a cross-sectional view of a portion of the FIG. 2 image sensor during various stages of processing performed in accordance with an embodiment of the invention.

FIGS. 3-8 show one exemplary method of forming the pixel sensor cell of FIG. 2. First a substrate 60, as shown in FIG. 3, is formed. For exemplary purposes, this substrate 60 is a p-type silicon substrate. Isolation regions 55 are formed to electrically isolate regions of the substrate where pixel cells will later be formed. The isolation regions 55 can be formed by any suitable technique such as thermal oxidation of the underlying silicon in a LOCOS process, or by etching trenches and filling them with oxide in an STI (shallow trench isolation) process. Following formation of isolation regions 55 if the p-type well 61 has not yet been formed, it may then be formed by blanket implantation or by masked implantation to produce the p-type well 61.

Figure 4:
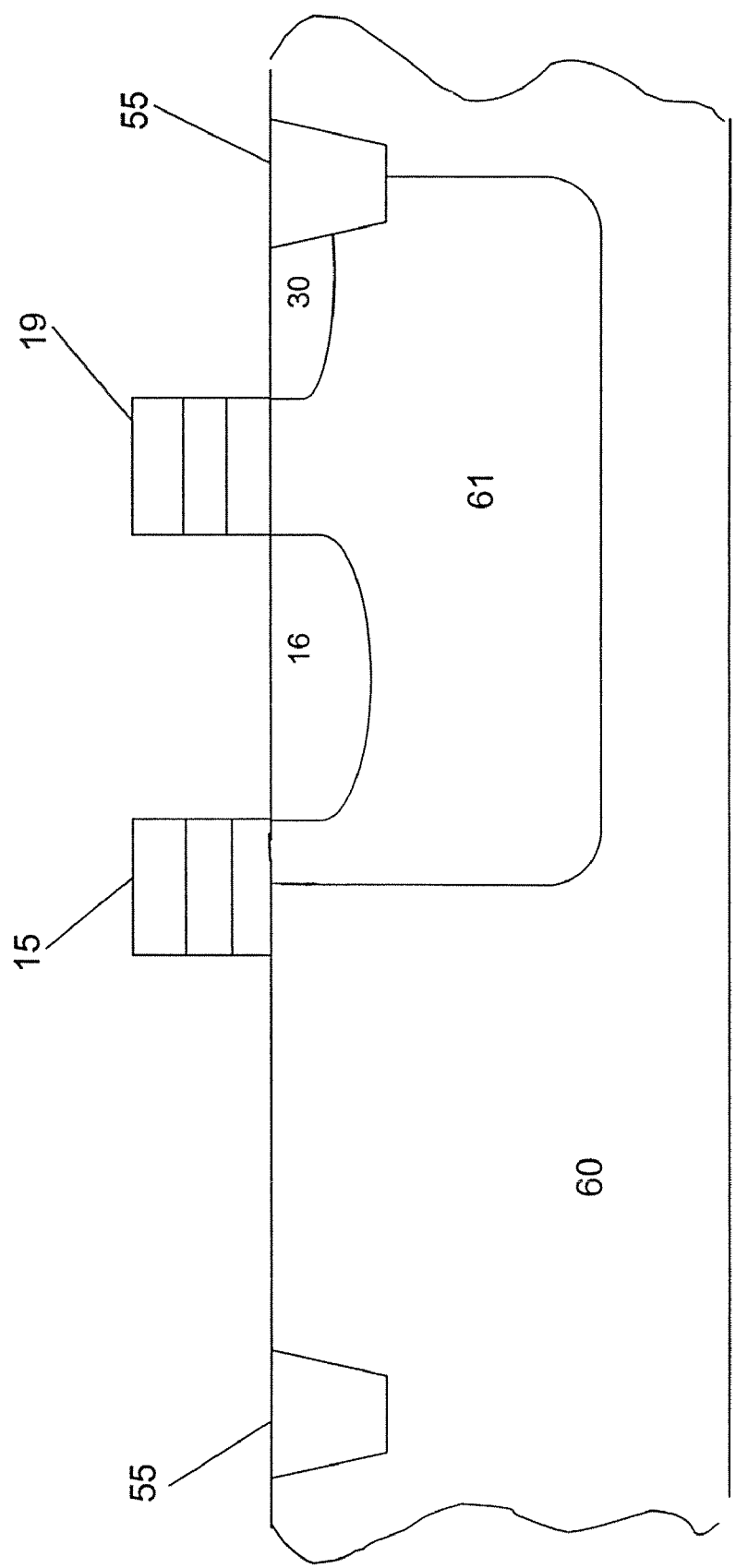
FIG. 4 shows a stage of processing subsequent to that shown in FIG. 3.
Figure 5:
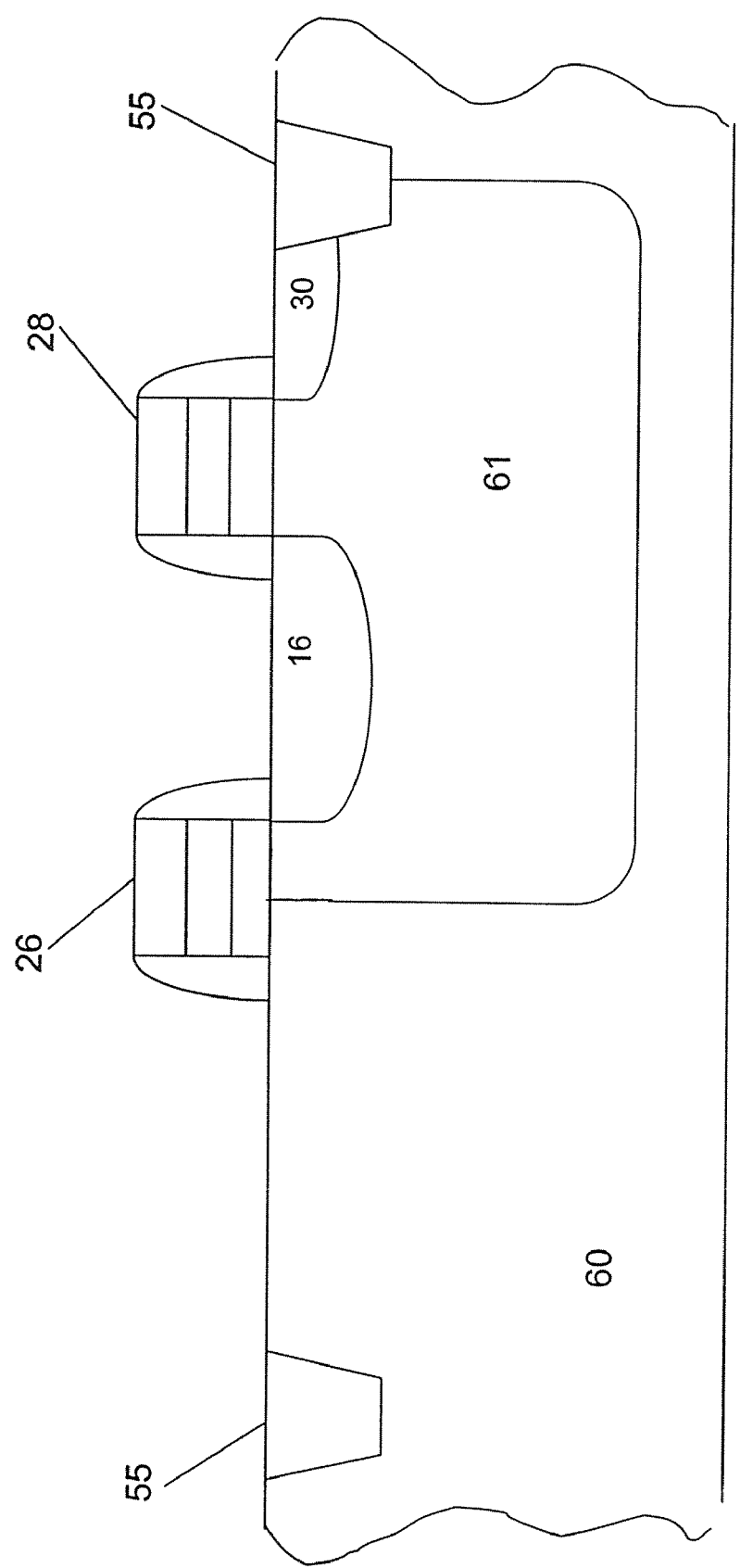
FIG. 5 shows a stage of processing subsequent to that shown in FIG. 4.

Next the circuitry of the pixel sensor cell, including a transfer gate stack 15, and reset gate stack 19 are formed by a suitable method, such as blanket deposition of gate oxide, doped polysilicon, deposition of metal for a silicide, deposition of nitride cap layer and annealing to form a silicide, then patterning and etching. The invention is not limited to the illustrated method of forming transistor gate stacks 15, 19. FIG. 4 shows an exemplary embodiment with formed gate stacks 15, 19 for a transfer transistor and a reset transistor, respectively.

A p-well 61 may be formed before or after the formation of isolation regions 55 and gate stacks 15, 19. The p-well implant may be conducted so that the pixel array well 61 and a periphery logic well have different doping profiles. As known in the art, multiple high energy implants may be used to tailor the profile of the p-type well 61.

For convenience, the same cross-sectional view of FIG. 2 is utilized in FIGS. 3-8 for the ensuing description, so the source follower and row select transistors are not illustrated. The invention will be described as formed in a p-type substrate; however the invention may also be formed in an n-well in an n-type substrate, and other photosensor structures may also be used.

Formed source/drain regions 30 and floating diffusion region 16 are also included in FIG. 4. The doped regions 30 and floating diffusion region 16 are formed in the p-well 61 and are doped to an n-type conductivity in this embodiment. For exemplary purposes, the regions 30, 16 are n+ doped and may be formed by applying a mask to the substrate and doping the regions 30 and 16 by ion implantation. The gate stack sidewall insulators (shown in FIG. 5) are then formed on the sides of the remaining gate stacks 33, 35 using any suitable technique.

Figure 6:
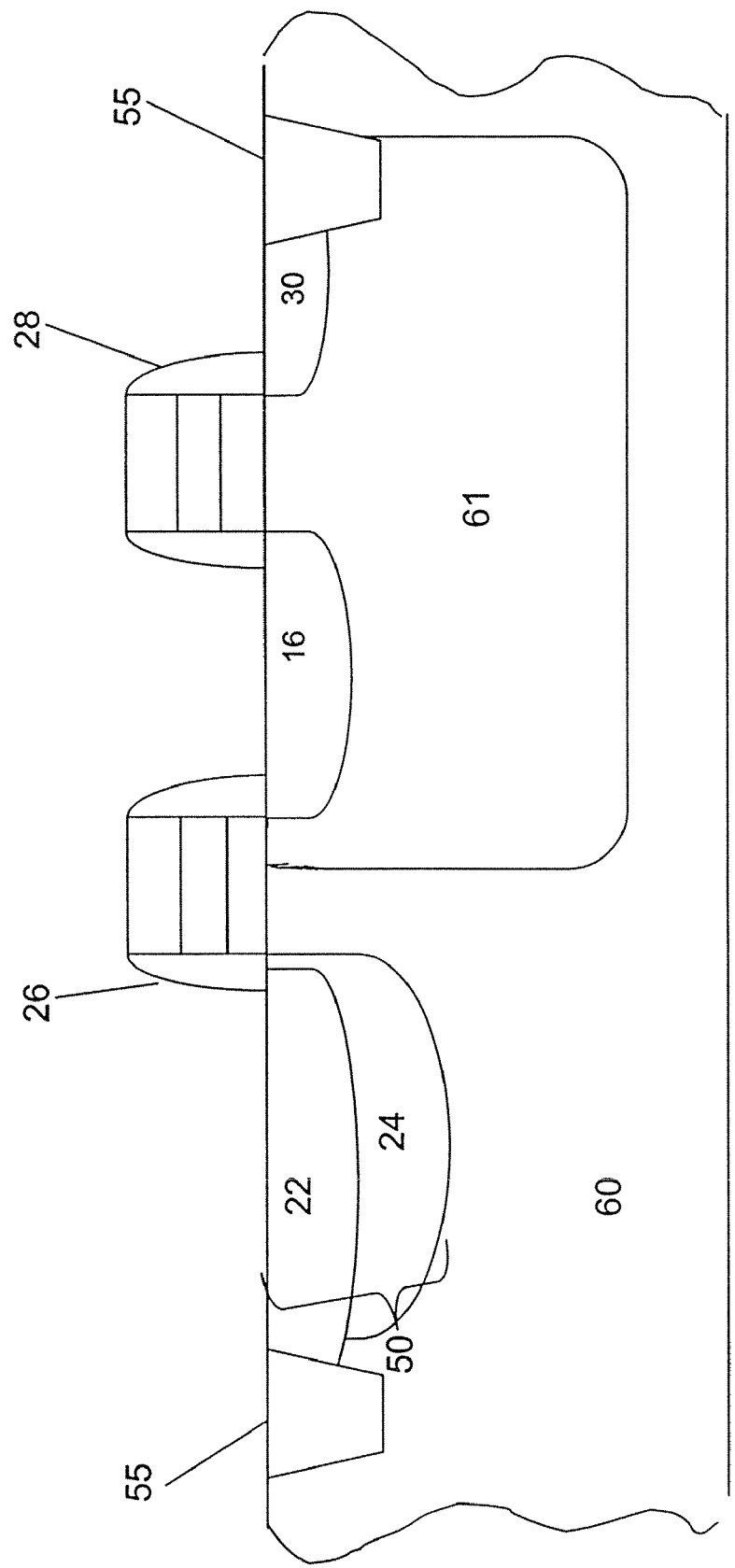
FIG. 6 shows a stage of processing subsequent to that shown in FIG. 5.
Figure 7:
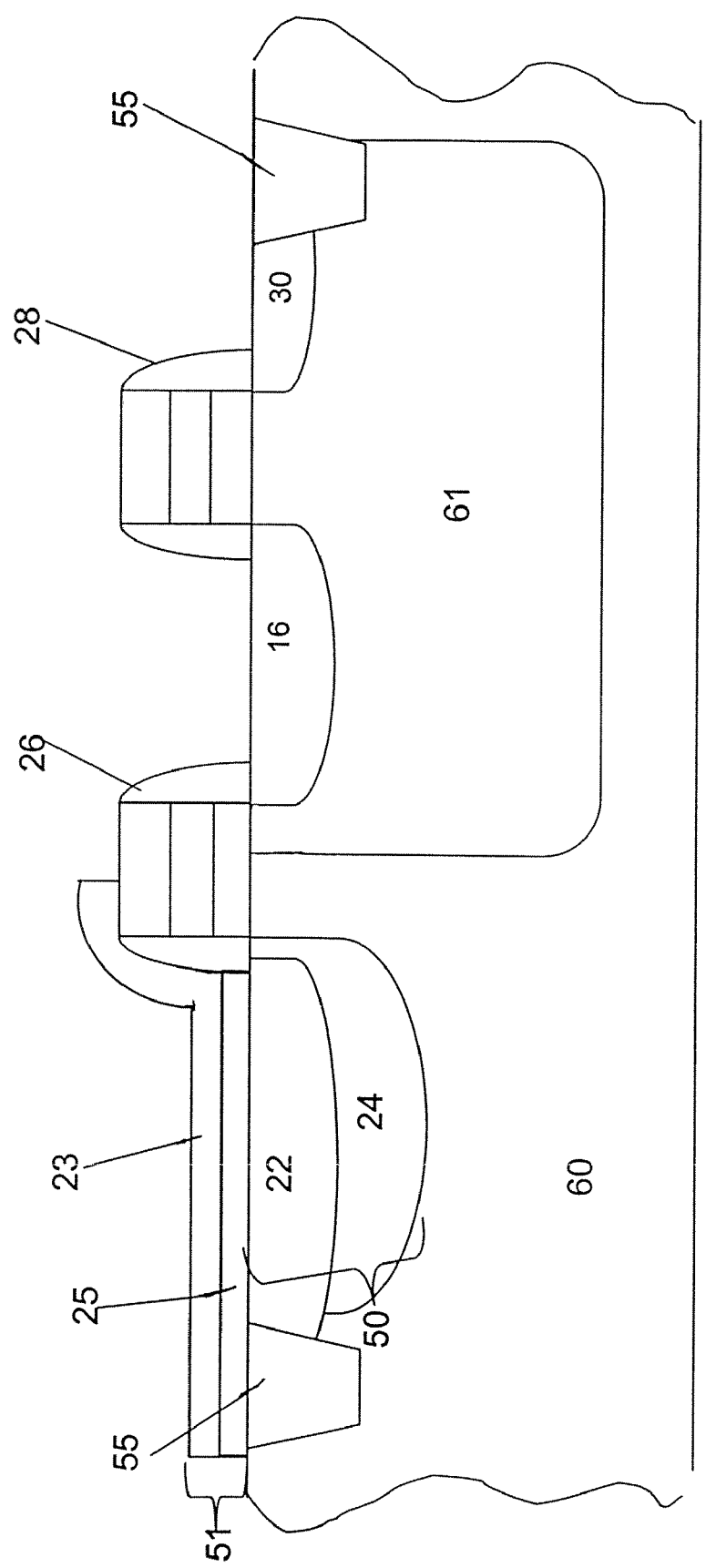
FIG. 7 shows a stage of processing subsequent to that shown in FIG. 6.

FIG. 6 shows implantation of the photodiode 50, having p-type region 22 and n-type region 24. The photodiode 50 may be implanted by a method known in the art. The photodiode gate 51 is then formed over the photodiode 50 on the surface of substrate 60, as shown in FIG. 7. A thin layer 25 of a dielectric substance, for exemplary purposes, silicon dioxide, is first formed on the area over the photodiode 50. The thickness of the layer 25 may be in the range of about 50-150 Å. Other dielectric substances can be used for layer 25 such as silicon nitride ($Si_3N_4$) or silicon oxynitride (SiON). Next, a polysilicon layer 23 is formed over layer 25. The polysilicon layer 23 is doped p+ in this exemplary embodiment, but may also be doped n-type. The thickness of layer 23 may be in the range of about 500-1500 Å. Other substances such as silicon germanium (SiGe) may also be used for layer 23, however, the proportion of silicon should be higher than germanium, for example $Si_{60}Ge_{40}$. The embodiment shown in FIG. 7 has a polysilicon layer 23 which overlaps part of the transfer transistor 26. The advantages of an overlapping polysilicon layer 23 include ease of production and increased energy barrier reduction.

Figure 8:
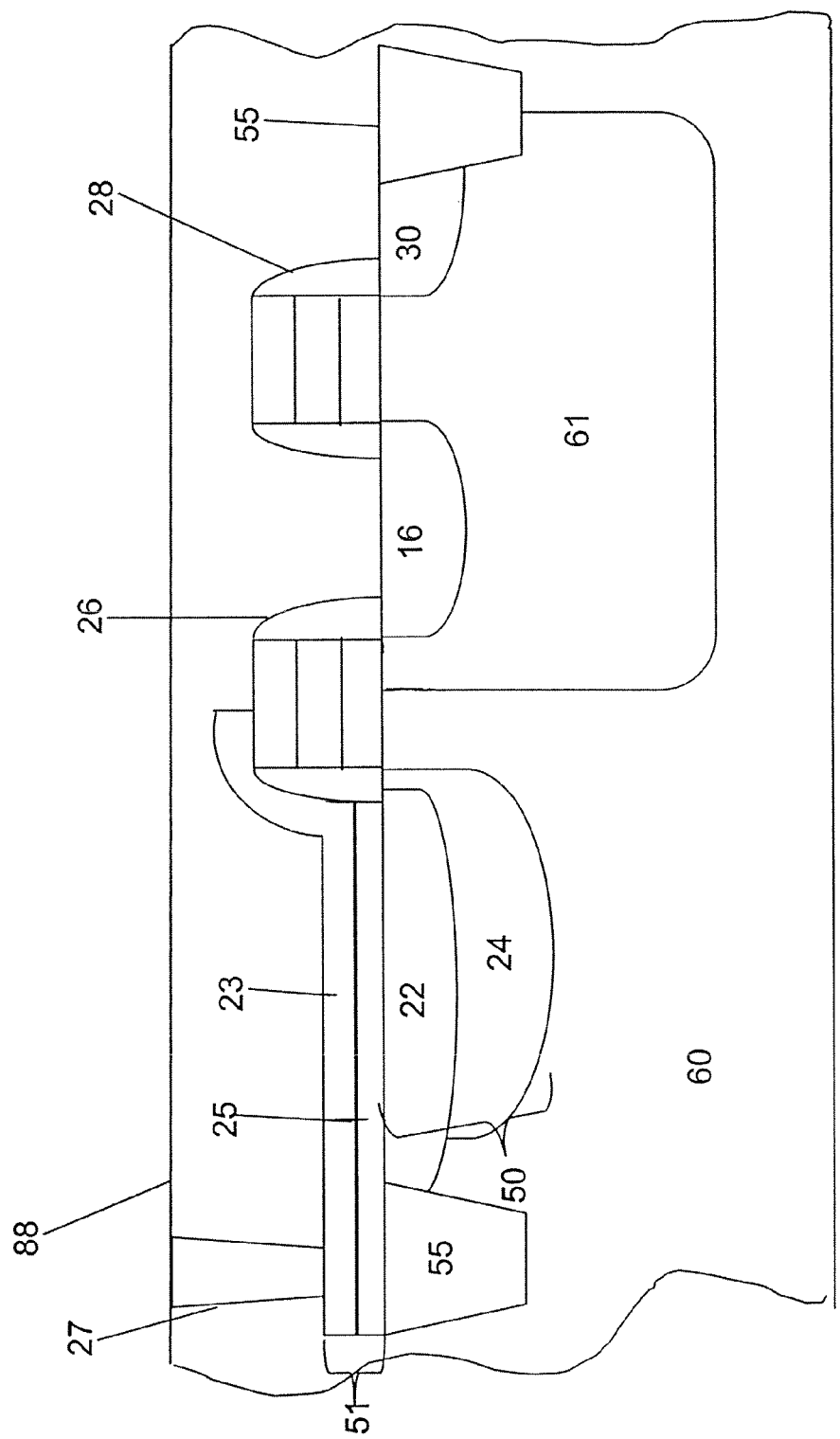
FIG. 8 shows a stage of processing subsequent to that shown in FIG. 7.

Conventional processing methods may be used to form insulating, shielding, and metallization layers to connect gate lines and other connections to the pixel sensor cells. For example, the entire surface may be covered with a passivation layer 88 (FIG. 8) of, for example, silicon dioxide, BSG, PSG, or BPSG, which is CMP planarized and etched to provide contact holes, which are then metallized to provide contacts. A contact 27 is also provided over the photodiode gate 51, as shown in FIG. 8. Conductors and insulators may be used to interconnect the structures and to connect the pixel to peripheral circuitry.

Figure 9:
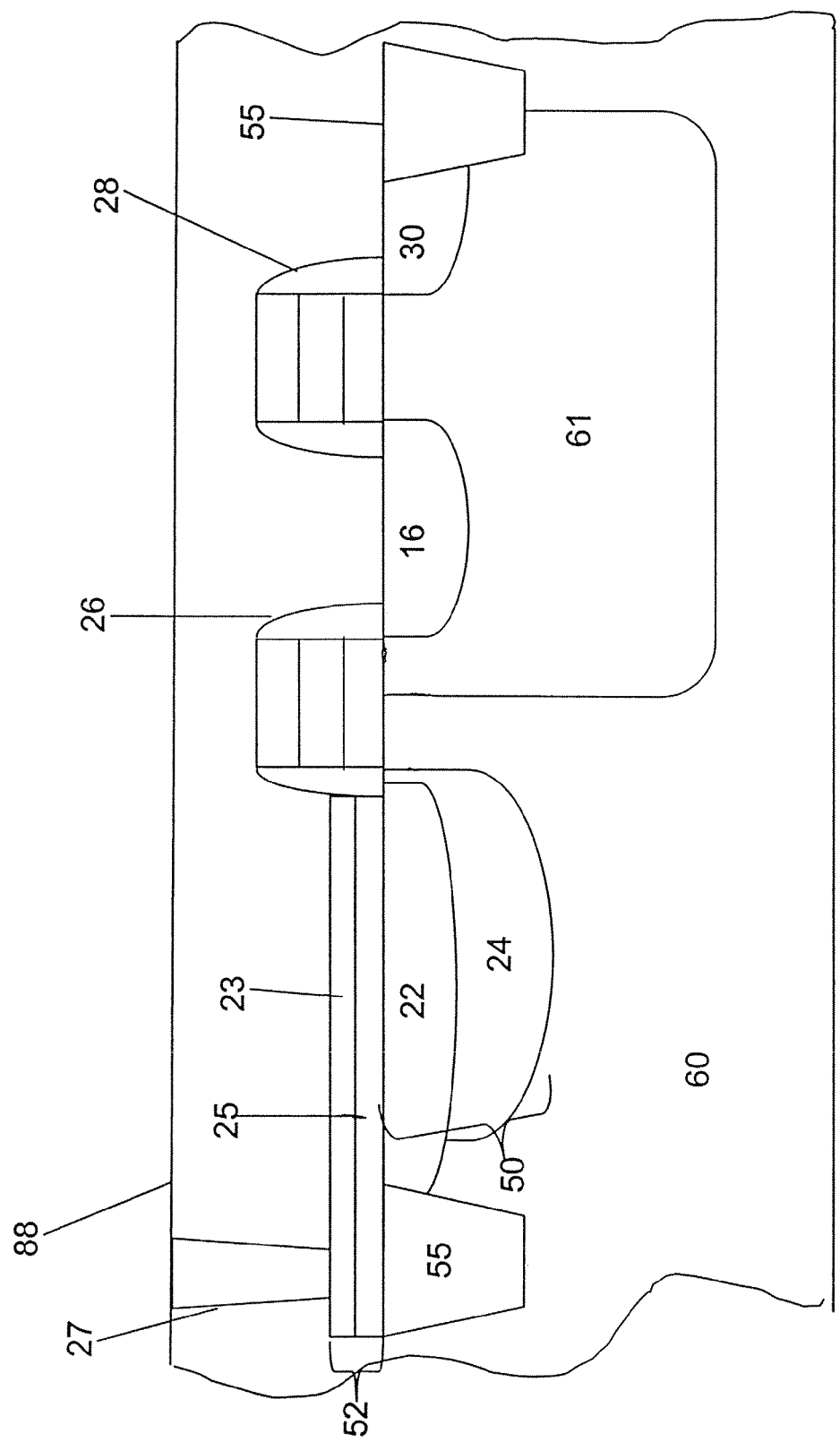
FIG. 9 shows another embodiment according to the invention.

FIG. 9 shows a second exemplary embodiment of the invention. The process for forming the embodiment shown in FIG. 9 is similar to the process shown in FIGS. 3-8, with the following exception. In the FIG. 9 embodiment, polysilicon layer 23 does not overlap the transfer transistor gate 26.

Figure 10:
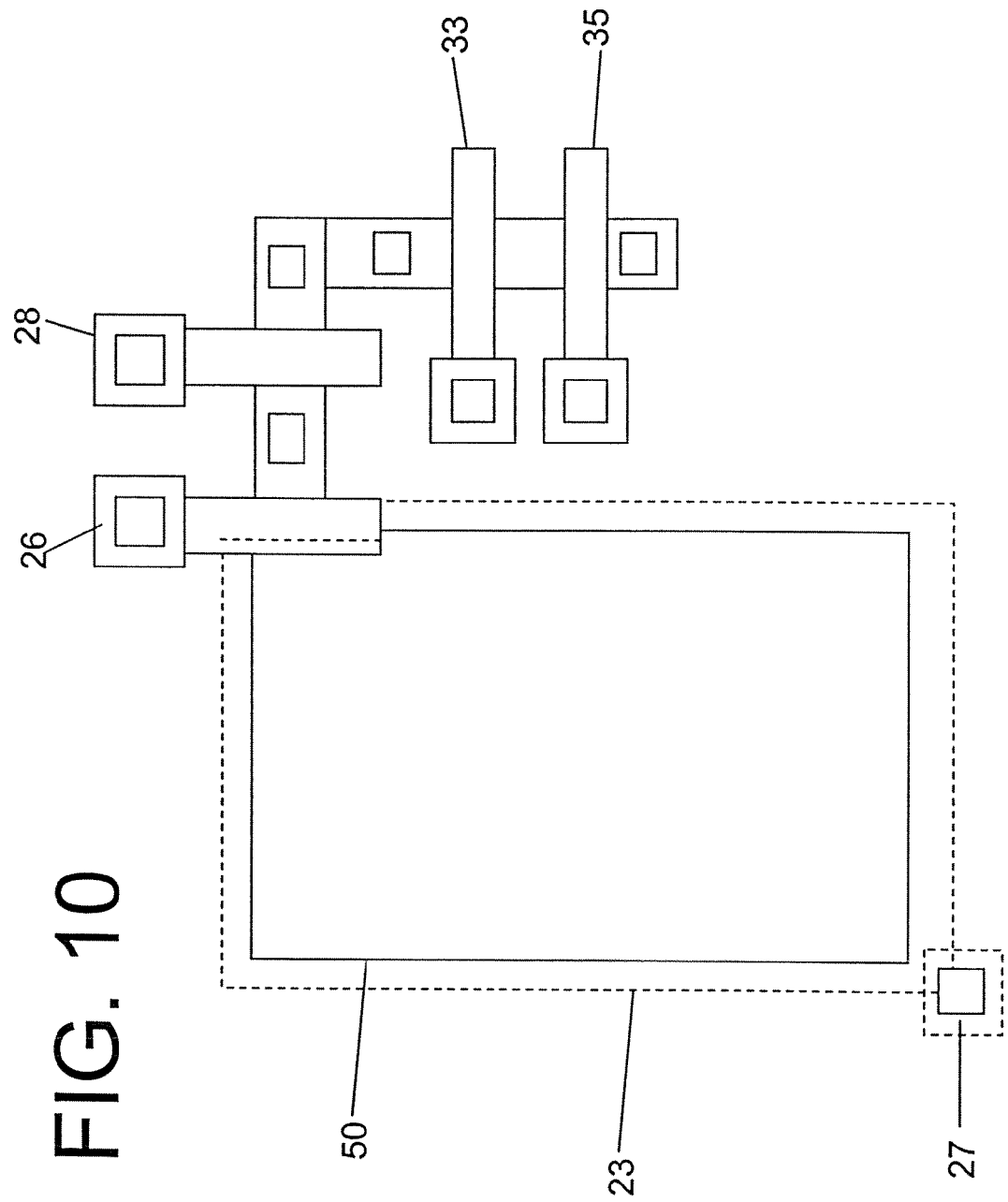
FIG. 10 shows a top view of an embodiment constructed according to the invention.

FIG. 10 illustrates a top view of the pixel sensor cell of FIG. 2. The dashed line 23 shows the extent of polysilicon layer 23. The photodiode 50 is beneath the polysilicon layer 23 and is connected to the transfer transistor 26, reset transistor 28, source follower transistor 33 and row select transistor 35. A contact 27 is also shown on the polysilicon layer 23.

The image sensors having photodiode gates shown in FIGS. 2-10 have reduced energy barriers between the photodiode 50 and the transfer transistor 26 and floating diffusion region 16. FIG. 11(*a*), (*b*) and (*c*) show timing, energy band and circuit diagrams for an embodiment according to the invention. After integration of photo-generated charges in the photodiode, the charges are transferred to the floating diffusion region. At this time, the floating diffusion region is empty in anticipation of the transferred charges. When the transfer gate is "ON" the charge can move to the lower potential floating diffusion region. However, in a typical CMOS image sensor, the energy barrier between the photodiode and transfer gate prohibits complete charge transfer. This energy barrier has a high pinning voltage ($V_{PIN}$) and is therefore difficult to completely overcome without the structure of the present embodiment.

In contrast, the photodiode gate of the invention reduces the $V_{PIN}$ to thereby reduce the energy barrier. FIG. 11(*a*) is a timing diagram which shows four time intervals labeled I, II, III and IV. FIG. 11(*b*) is an energy band diagram which corresponds to the time intervals shown in FIG. 11(*b*). At time I, the transfer gate and photodiode gate are at rest. At time II, the transfer gate is turned on and after a time delay, negative bias is applied to the photodiode gate to lower the photodiode barrier as shown in FIG. 11(*b*) part II. The photodiode $V_{PIN}$ is adjusted such that all charges spill over into the floating diffusion region 16 as shown in part III of FIG. 11(*b*) and none remain in the photodiode 50. Part IV of FIGS. 11(*a*) and 2(*b*) show the reset of the transfer gate 26 and photodiode gate 51. FIG. 11(*c*) shows a diagram of image sensor circuitry with a plurality of pixels where photodiode gates on the same row are combined at one photodiode gate signal line.

Figure 12:
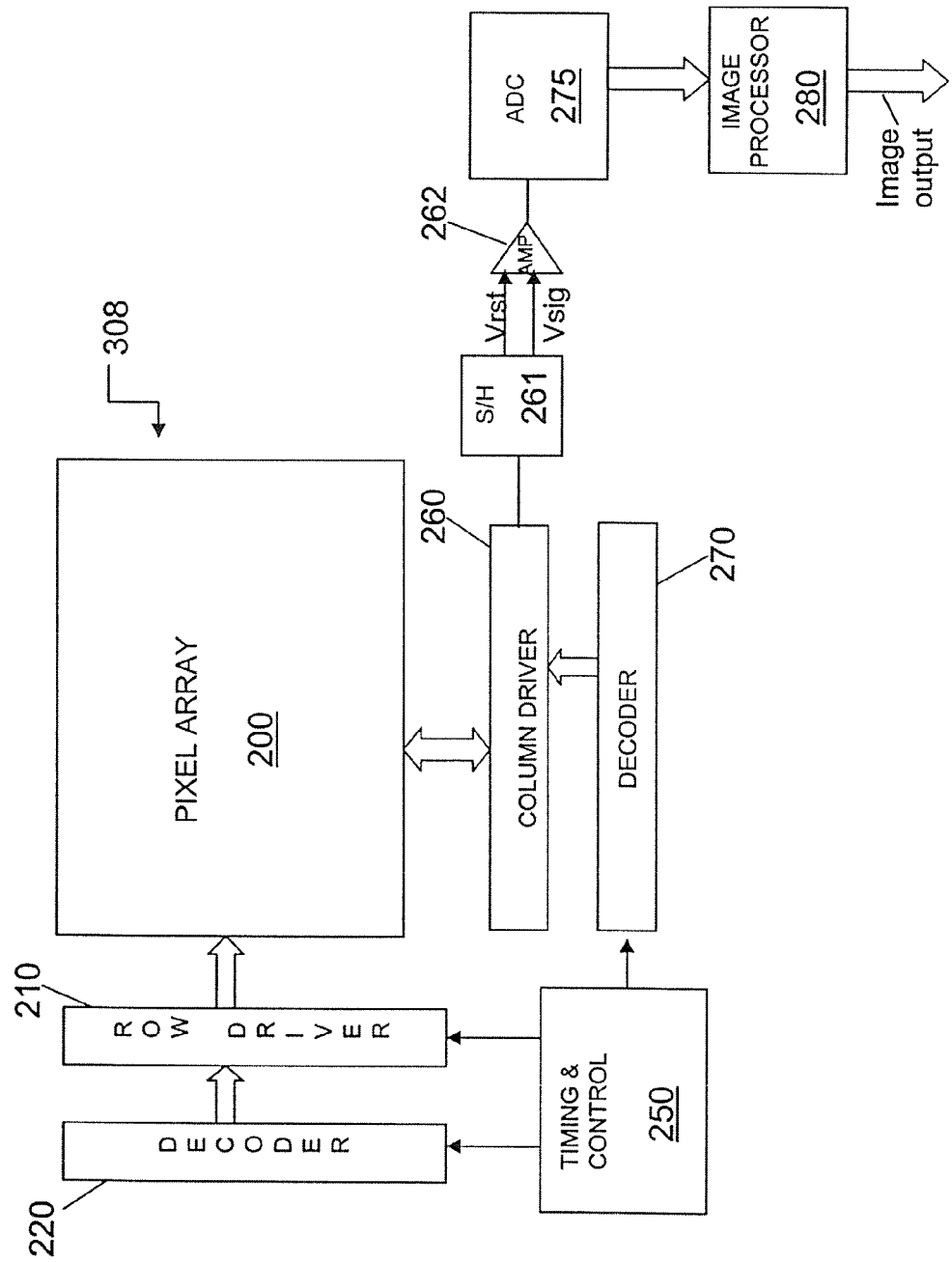
FIG. 12 is a block diagram of an imager chip having a pixel array.

FIG. 12 illustrates a block diagram of an exemplary imager device 308 that may be used in accordance with an embodiment of the invention. Imager 308 has a pixel array 200 with each pixel cell being constructed as described above. The row lines are selectively activated by a row driver 210 in response to row address decoder 220. A column driver 260 and column address decoder 270 are also included. The imager is operated by the timing and control circuit 250, which controls address decoders 220, 270. The control circuit 250 also controls the row and column driver circuitry 210, 260. A sample and hold circuit 261 associated with the column device 260 reads a pixel reset signal ($V_{rst}$) and a pixel image signal ($V_{sig}$) for selected pixels. A differential signal ($V_{rst}$-$V_{sig}$) is produced by differential amplifier 262 for each pixel which is digitized by analog to digital converter 275 (ADC). The analog to digital converter 275 supplies the digitized pixel signals to an image processor 280 which forms a digital image.

FIG. 13 shows a processor system 300, which includes an imager device 308 (FIG. 12) with pixel sensor cells constructed in accordance with the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 12 with the pixel array 200 having the characteristics of the invention as described above in connection with FIGS. 2-12. The imager device 308 may, in turn, be coupled to processor 302 for image processing, or other image handling operations.

The processes and devices described above illustrate preferred methods and typical devices of many that could be used and produced. The above description and drawings illustrate embodiments which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and disered to be protected by Letters Patent of the United States:

1. A pixel sensor cell comprising:
   a substrate;
   a photoconversion device comprising a region of a first conductivity type at a surface of the substrate and a region of a second conductivity type below the first conductivity type region, the photoconversion device having a pinning voltage;
   a gate, wherein at least a portion of the gate is located directly over the photoconversion device for changing the pinning voltage; and
   a charge collection region for receiving charges from the photoconversion device.

2. The pixel sensor cell according to claim 1, wherein the gate comprises a dielectric material and a polysilicon material.

3. The pixel sensor cell according to claim 1, wherein the photoconversion device comprises a pinned photodiode.

4. The pixel sensor cell according to claim 1, wherein the charge collection region comprises a floating diffusion region.

5. A pixel sensor cell comprising:
   a substrate;
   a photoconversion device comprising a region of a first conductivity type at a surface of the substrate and a region of a second conductivity type below the first conductivity type region;
   a gate located over the photoconversion device; and
   a charge collection region for receiving charges from the photoconversion device,
   wherein the pixel sensor cell is configured to have a first pinning voltage when no bias is applied to the gate and a second pinning voltage when a negative bias is applied to the gate.

6. The pixel sensor cell according to claim 5, wherein the gate reduces an energy barrier between the photoconversion device and the charge collection region.

7. A pixel sensor cell comprising:
   a substrate having a first surface level;
   a photoconversion device having a first doped region of a first conductivity type and a second doped region of a second conductivity type located within the substrate, the photoconversion device having a pinning voltage;
   a dielectric material formed over the first surface level of the substrate thereby forming a second surface level;
   a polysilicon material formed over the second surface level; and
   a contact connected to the polysilicon material for receiving a voltage to change the pinning voltage.

8. The pixel sensor cell according to claim 7, wherein the dielectric material comprises silicon dioxide.

9. The pixel sensor cell according to claim 7, wherein the dielectric material comprises silicon nitride ($Si_3N_4$).

10. The pixel sensor cell according to claim 7, wherein the dielectric material comprises silicon oxynitride (SiON).

11. The pixel sensor cell according to claim 7, wherein the polysilicon material comprises silicon germanium.

12. A pixel sensor cell comprising:
    a substrate;
    a photoconversion device comprising a region of a first conductivity type at a surface of the substrate and a region of a second conductivity type below the first conductivity type region;
    a gate located directly over at least a portion of and in a plane vertical to the photoconversion device;
    a contact connected to the gate; and
    a charge collection region for receiving charges from the photoconversion device,
    wherein the pixel sensor cell is arranged such that the photoconversion device has a reduced pinning voltage ($V_{PIN}$) when a negative bias is applied to the contact.

13. The pixel sensor cell according to claim 12, wherein the gate is configured to reduce an energy barrier between the photoconversion device and the charge collection region.

* * * * *